United States Patent
Ito

(10) Patent No.: US 7,617,431 B2
(45) Date of Patent: Nov. 10, 2009

(54) METHOD AND APPARATUS FOR ANALYZING DELAY DEFECT

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 322 days.

(21) Appl. No.: 11/709,256

(22) Filed: Feb. 22, 2007

(65) Prior Publication Data

US 2008/0072108 A1 Mar. 20, 2008

(30) Foreign Application Priority Data

Sep. 20, 2006 (JP) ............................. 2006-253651

(51) Int. Cl.
*G01R 31/28* (2006.01)

(52) U.S. Cl. .......................... 714/744; 714/25; 714/32; 714/700; 714/714; 714/719; 714/723; 714/724; 714/726; 714/731; 714/735; 713/500; 713/501; 702/69; 702/75; 702/106; 702/108; 702/117; 324/364; 324/160

(58) Field of Classification Search ........................ None
See application file for complete search history.

(56) References Cited

U.S. PATENT DOCUMENTS

| | | | | |
|---|---|---|---|---|
| 5,982,189 | A * | 11/1999 | Motika et al. ................ | 324/763 |
| 6,535,986 | B1 * | 3/2003 | Rosno et al. ................ | 713/400 |
| 6,829,573 | B1 * | 12/2004 | Matsumoto et al. ........... | 703/20 |
| 6,901,546 | B2 * | 5/2005 | Chu et al. .................... | 714/738 |
| 6,996,701 | B2 | 2/2006 | Shimamura | |
| 7,043,389 | B2 * | 5/2006 | Plusquellic .................. | 702/117 |
| 7,461,310 | B2 * | 12/2008 | Wang .......................... | 714/729 |
| 2007/0162240 | A1 * | 7/2007 | Foster et al. .................. | 702/69 |
| 2007/0288818 | A1 * | 12/2007 | Wang .......................... | 714/726 |

FOREIGN PATENT DOCUMENTS

| | | |
|---|---|---|
| JP | 3450814 | 7/2003 |
| JP | 3605506 | 10/2004 |
| JP | 2005-214732 | 8/2005 |

OTHER PUBLICATIONS

K. Heragu, J.H. Patel, et al, "Segment Delay Faults: A New Fault Model", Proc. VLSI Test Symposium, 1996 (pp. 32-39).

* cited by examiner

*Primary Examiner*—John P Trimmings
(74) *Attorney, Agent, or Firm*—Staas & Halsey LLP

(57) ABSTRACT

The apparatus for analyzing a delay defect of the present invention obtains the RC of the maximal incidence among region codes (RCs) to which check circuits detecting errors caused with gradual increase in the frequency of an operational clock pulse fed to an integrated circuit belongs. The apparatus obtains information on latch in which an error is caused with the RC of the maximal incidence, with reference to a mapping table that describes the mapping relationship between an RC and a latch. The apparatus extracts a circuit portion in which an error can be captured with the region code of the maximal incidence by exhaustively tracing back circuit portions connected with each obtained latch, from the latch to the latch described in the mapping table. The apparatus gives delay defects to the input and the output pin of each of logic elements included in the extracted circuit portion, generates test patterns for detecting the given delay defects, and performs delay tests.

9 Claims, 8 Drawing Sheets

```
21
   RC1 : FF0-31, FF40-71, ................
   RC2 : FF120, FF130, ................
                     .
                     .
                     .
   RCn : FF15-63, FF180, ................
```

FIG.4

```
For (i = respective latches corresponding to RC of maximal incidence) {
    While (1) {
        give trace start mark to latch i
        start latch = latch i
        performing depth-first tracing back from start latch to the next destination
        latch and give transit marks to passed circuits if (destination latch is registered in RC-to-latch mapping table)
            then {
                give destination latch mark to destination latch
                stop the tracing back and leave While
            }
            else start latch = destination latch
    }
}
```

METHOD AND APPARATUS FOR ANALYZING DELAY DEFECT

CROSS-REFERENCE TO RELATED APPLICATIONS

This application claims the conventional priority based on Japanese Application No. 2006-253651, filed on Sep. 20, 2006, the disclosures of which are incorporated herein by reference.

BACKGROUND OF THE INVENTION

1. Field of the Invention

The present invention generally relates to a method and apparatus for analyzing a delay defect which analyze a delay defect in an integrated circuit, and more particularly, to a method and apparatus for analyzing a delay defect which enable rapid and unique determination of a circuit portion that is a bottleneck in frequency performance.

2. Description of the Related Art

With gradual increase in the frequency of an operational clock pulse fed to an LSI, the LSI becomes non-operative. In this situation, if a circuit portion that limits the frequency is found, the cause that makes the LSI non-operative can be determined.

By determining the cause and modifying the problematic unit eventually, design for higher performance as well as for higher frequency yield rate can be achieved.

Additionally, when manufactured LSIs are shipped, it is required to perform inspection on whether or not the LSIs have the specified frequency performance.

Based on the foregoing background, the frequency performances of manufactured LSIs are tested.

The scan test method is among the test methods. The scan test method, as illustrated in FIG. 8, provides a path (scan chain) to control and observe all the flip-flops in an LSI from external pins directly, sets respective test patterns for the flip-flop in the LSI by using the scan chain, observes how the LSI operates in response to the test patterns, and tests whether or not the manufactured LSI has desired performances (such as logic performance and frequency performance).

In a conventional technique, in order to determine, according to the scan test method, which circuit portion of an LSI is a bottleneck in frequency performance, a test pattern (which realizes a slow-to-rise delay defect), which changes the values at the input or the output pin of each logic element in the LSI from 0 to 1, and a test pattern (which realizes a slow-to-fall delay defect), which changes the values at the input or the output pin of each logic element in the LSI from 1 to 0, are created. Then, it is found out which circuit portion of the LSI is a bottleneck in frequency performance by using the test patterns.

In other words, as illustrated in FIG. 9, when a slow-to-rise delay defect is given to the output pin of a logic element located between a transmission latch and a reception latch, by using the test pattern and through the transmission latch, the value at the output pin of the logic element is made to change from 0 to 1 according to the first pulse, and then, through the reception latch, it is ascertained whether or not the value at the output pin of the logic element has changed from 0 to 1 according to the second pulse set based on the pulse period of a testing frequency, whereby it is ascertained whether or not a slow-to-rise delay defect is being caused in the logic element.

However, in the conventional technique, a slow-to-rise delay defect or a slow-to-fall delay defect is given to the input or the output pin of each logic element in an LSI. Therefore, it is required to create a great number of test patterns, whereby it is difficult to determine the circuit portion that is a bottleneck in frequency performance rapidly.

Here, with regard to a delay test in which a slow-to-rise delay defect and a slow-to-fall delay defect are detected, the segment delay test is known that is disclosed in Non-Patent Document 1 (K. Heragu, J. H. Patel, et al, "Segment Delay Faults: A New Fault Model", Proc. VLSI Test Symposium, 1996).

Meanwhile, in a high-reliability LSI, a great number of checking circuits, such as a parity-error checking circuit and the like, are integrated. Furthermore, in order to make it possible to determine in which portion in an LSI a parity error or the like is caused, identifiers named "region codes (RCs)" are given to the checking circuits.

With gradual increase in the frequency of an operational clock pulse fed to an LSI, the LSI becomes non-operative. However, in case the parity-error checking circuits are integrated, a parity error is caused and the region code to which a checking circuit that has detected the parity error belongs can be obtained.

It is possible to estimate which circuit portion is a bottleneck in frequency performance according to the region code obtained as described above.

Here, Patent Documents 1 to 3 described below disclose techniques related to the present invention.

Patent Document 1 (Japanese Patent Application Laid-Open No. 2005-214732) discloses an invention in which, in order to facilitate the delay defect analysis, a hardware circuit is added.

However, the present invention does not employ any configuration in which, for performing the delay defect analysis, a hardware circuit is added.

Additionally, Patent Document 2 (Japanese Patent No. 3605506) discloses an invention detecting the period T1 of an operational clock pulse with which the LSI does not operate normally and the period T2 of an operational clock pulse with which the LSI operates normally. Then the invention sets the period of an arbitrary pulse among n operational clock pulses to T2 and sets the periods of the other operational clock pulses to T1. N denotes the number of operational clock pulses in the duration from the moment when predetermined data is inputted to an LSI to the moment when the data that responds to the input data is outputted. Then, the invention searches the critical path by checking the position of the operational clock pulses the period of which is set to T2 among n operational clock pulses when normal data is outputted.

However, the present invention employs a configuration in which a delay-defect position of an LSI is determined by using test patterns. Therefore, the configuration of the present invention is completely different from that of the invention disclosed in Patent Document 2.

Additionally, Patent Document 3 (Japanese Patent No. 3450814) discloses an invention related to optimal pipelining control in which the critical path is taken into consideration.

As described above, in the conventional technique, a test pattern, which changes the values at the input or the output pin of each logic element in the LSI from 0 to 1, and a test pattern, which changes the values at the input or the output pin of each logic element in the LSI from 1 to 0, are created, and by using the test patterns, it is found out which circuit portion in the LSI is a bottleneck in frequency performance.

However, in the foregoing conventional technique, a slow-to-rise delay defect or a slow-to-fall delay defect is given to the input or the output pin of each logic element in an LSI. Therefore, it is required to create a great number of test patterns, whereby it is difficult to determine the circuit portion that is a bottleneck in frequency performance rapidly.

Meanwhile, a region code to which a check circuit, detecting a parity error caused with gradual increase in the frequency of an operational clock pulse fed to an LSI belongs can be used to estimate which circuit portion is a bottleneck in frequency performance.

However, a circuit that is covered by a single region code includes several tens to several hundreds of latches (flipflops) as memory devices.

Therefore, with a method in which a circuit portion that is a bottleneck in frequency performance is estimated by using region codes, it is difficult to determine the circuit portion that is a bottleneck in frequency performance uniquely.

SUMMARY OF THE INVENTION

It is an object of the present invention to provide a method for analyzing a delay defect that enables rapid and unique determination of a circuit portion that is a bottleneck in frequency performance in analyzing a delay defect in an integrated circuit.

It is another object of the present invention to provide an apparatus for analyzing a delay defect that enables rapid and unique determination of a circuit portion that is a bottleneck in frequency performance in analyzing a delay defect in an integrated circuit.

The method for analyzing a delay defect of the present invention is the method for analyzing a delay defect in an integrated circuit. The method comprises gradually raising a frequency of an operational clock for each of integrated circuits to be analyzed for a delay defect and collecting region codes when respective first errors are caused, and tallying the collected region codes and determining a region code of a maximal incidence.

Preferably, the method of the present invention further comprises obtaining information on in which latch an error is caused with the region code of the maximal incidence, with reference to a mapping table that describes the mapping relationship between a region code and latches under the region code, and extracting a circuit portion in which an error can be captured with the region code of the maximal incidence by exhaustively tracing back circuit portions connected with each obtained latch from the obtained latch to a latch under the region code described in the mapping table.

Preferably, the method of the present invention further comprises giving delay defects to an input and an output pin of each of logic elements included in the extracted circuit portion and generating delay-defect-detection test patterns for detecting the given delay defects.

Preferably, in the method of the present invention, in generating the delay-defect-detection test patterns, based on circuit characteristic of an integral circuit as a delay defect analysis subject, by selecting a delay-defect-detection test pattern that realizes a test path having the circuit characteristic among delay-defect-detection test patterns that enable detection of the delay defects, generating the delay-defect-detection test patterns for detecting the delay defects.

Preferably, the method of the present invention further comprises performing a delay test on an integrated circuit in which an error is caused with the region code of the maximal incidence by using the generated delay-defect-detection test patterns, and selecting a delay-defect-detection test pattern that causes a defect of a value different from an expected value, and analyzing the cause of a delay defect based on the selected delay-defect-detection test pattern.

Preferably, in the method of the present invention in analyzing the cause of the delay defect, analyzing the cause of a delay defect by comparing paths realized by the selected delay-defect-detection test pattern and by determining whether or not a commonly passed position exists.

Preferably, in the method of the present invention, in analyzing the cause of a delay defect, analyzing the cause of a delay defect by comparing the circuit characteristics of paths realized by the selected delay-defect-detection test pattern and by determining whether or not a common circuit characteristic exists.

The apparatus for analyzing a delay defect is the apparatus for analyzing a delay defect that analyzes a cause of a delay defect by performing a delay test on an integrated circuits in which an error is caused with a region code of a maximal incidence selected among integrated circuits to be analyzed for a delay defect. The apparatus comprises an obtaining unit obtaining information on in which latch an error is caused with the region code of the maximal incidence, with reference to a mapping table that describes the mapping relationship between a region code and latches under the region code, an extracting unit extracting a circuit portion in which an error can be captured with the region code of the maximal incidence by exhaustively tracing back circuit portions connected with each of latches obtained by the obtaining unit from the obtained latch to a latch under the region code described in the mapping table, and a generating unit giving delay defects to an input and an output pin of each of logic elements included in the circuit portion extracted by the extracting unit and generating delay-defect-detection test patterns for detecting the given delay defects.

Preferably, the apparatus of the present invention further comprises a selecting unit performing a delay test on an integrated circuit in which an error is caused with the region code of the maximal incidence by using the generated delay-defect-detection test patterns, and selecting a delay-defect-detection test pattern that causes a defect of a value different from an expected value, and an analyzing unit analyzing the cause of a delay defect based on the delay-defect-detection test pattern selected by the selecting unit.

According to the present invention configured as described above, by narrowing circuit portions that are bottleneck in frequency performance and generating the delay-defect-detection test patterns for the narrowed circuit portions, it is made possible to determine which circuit portions among the narrowed circuit portions are the bottlenecks in frequency performance. Therefore, in case a delay defect in an integrated circuit is analyzed, the determination of the circuit portion that is the bottleneck in frequency performance can be implemented rapidly and uniquely.

BRIEF DESCRIPTION OF THE DRAWINGS

FIG. 4 is an algorithm performed by a test subject circuit portion extraction unit.

DETAILED DESCRIPTION OF THE PREFERRED EMBODIMENTS

Figure 1:
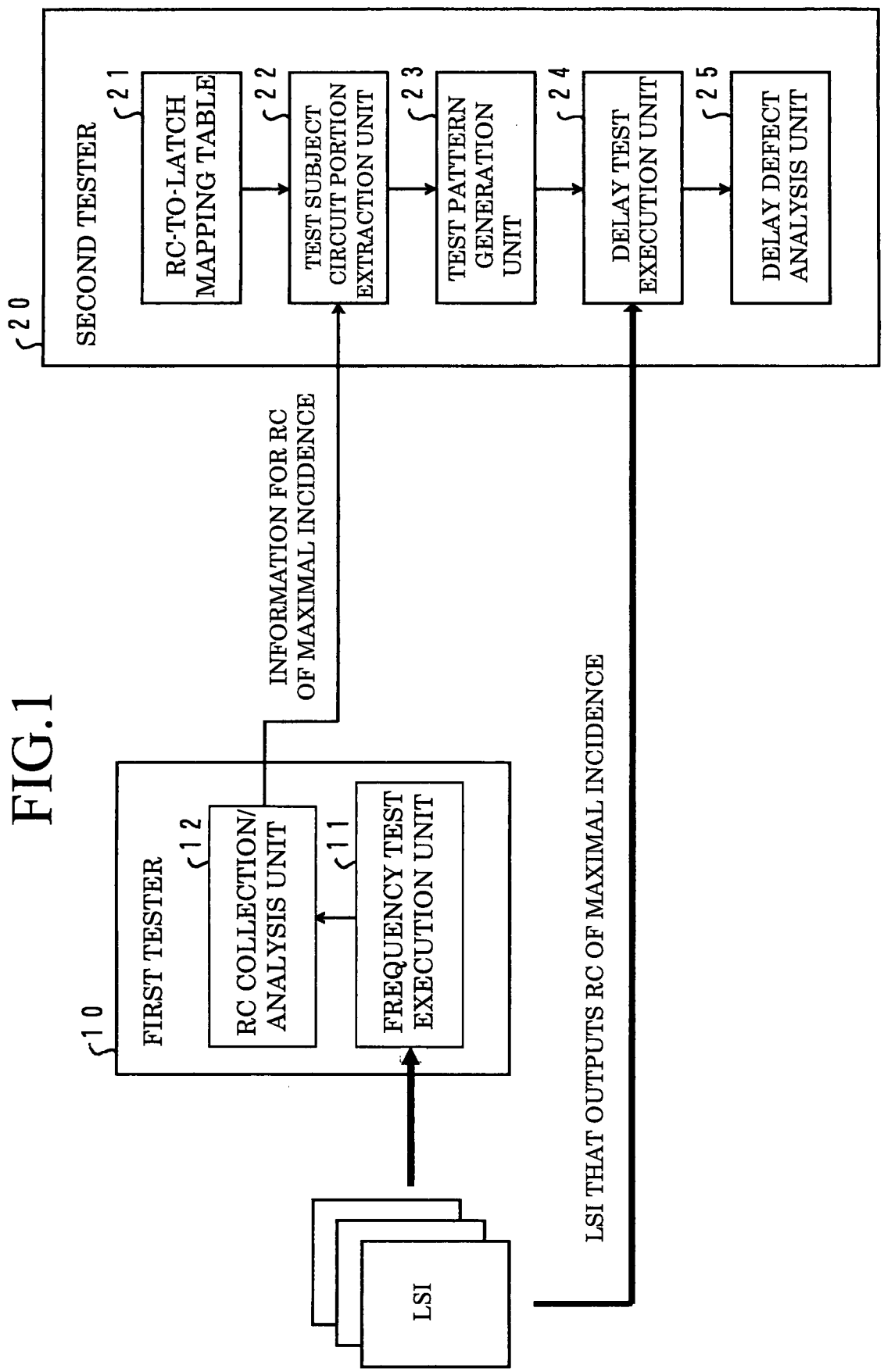
FIG. 1 is a diagram illustrating an embodiment of the present invention.

Firstly, the outline of the present invention is described as follows. The apparatus for analyzing a delay defect of the present invention analyzes a cause of a delay defect by performing delay test on an integrated circuit in which an error is caused with a region code of a maximal incidence selected among integrated circuits to be analyzed for a delay defect. For example, the apparatus includes (1) an obtaining unit obtaining information on in which latch an error is caused with the region code of the maximal incidence, with reference to a mapping table that describes the mapping relationship between a region code and latches under the region code, (2) an extracting unit extracting a circuit portion in which an error can be captured with the region code of the maximal incidence by exhaustively tracing back circuit portions connected with each of latches obtained by the obtaining unit from the obtained latch to a latch under the region code described in the mapping table, (3) a generating unit giving delay defects to an input and an output pin of each of logic elements included in the circuit portion extracted by the extracting unit and generating delay-defect-detection test patterns for detecting the given delay defects, (4) a selecting unit performing a delay test on an integrated circuit in which an error is caused with the region code of the maximal incidence by using the generated delay-defect-detection test patterns, and selecting a delay-defect-detection test pattern that causes a defect of a value different from an expected value, and (5) an analyzing unit analyzing the cause of a delay defect based on the delay-defect-detection test pattern selected by the selecting unit.

The processing unit described above can also be realized by a computer program. The computer program is provided in a state being recorded in an appropriate storage medium that can be read by a computer, or through a network. When the present invention is implemented, the computer program is installed so as to operate on a control unit such as a CPU, thereby realizing the present invention.

In the apparatus for analyzing a delay defect of the present invention, the apparatus itself or a separately provided apparatus gradually raises a frequency of an operational clock for each of integrated circuits to be analyzed for a delay defect and the apparatus of the present invention collects region codes when respective first errors are caused. The apparatus tallies the collected region codes and determines the region code of the maximal incidence to select test-subject integrated circuits (integrated circuits in which parity errors are caused with the region code of the maximal incidence). The apparatus implements the following delay tests on the integrated circuits to analyze the causes of delay defects in the integrated circuits.

In other words, the apparatus for analyzing a delay defect of the present invention, in the first place, obtains information on in which latch an error is caused with the region code of the maximal incidence, with reference to a preliminarily created mapping table that describes the mapping relationship between a region code and latches under the region code.

Subsequently, the apparatus extracts a circuit portion in which an error can be captured with the region code of the maximal incidence by exhaustively tracing back circuit portions connected with each obtained latch, from the obtained latch to a latch under the region code described in the mapping table.

Subsequently, the apparatus gives delay defects to an input and an output pin of each of logic elements included in the extracted circuit portion and generating delay-defect-detection test patterns for detecting the given delay defects.

Preferably, based on circuit characteristic of an integral circuit as a delay defect analysis subject, the apparatus generates the delay-defect-detection test patterns for detecting the delay defects by selecting a delay-defect-detection test pattern that realizes a test path having the circuit characteristic among delay-defect-detection test patterns that enable detection of the delay defects.

Subsequently, the apparatus performs a delay test on an integrated circuit in which an error is caused with the region code of the maximal incidence by using the generated delay-defect-detection test patterns, and selects a delay-defect-detection test pattern that causes a defect of a value different from an expected value.

Subsequently, the apparatus analyzes the cause of a delay defect based on the selected delay-defect-detection test pattern.

For example, the apparatus analyzes the cause of the delay defect by comparing paths realized by the selected delay-defect-detection test pattern and by determining whether or not a commonly passed position exists. Additionally, for example, the apparatus analyzes the cause of the delay defect by comparing the circuit characteristics of paths realized by the selected delay-defect-detection test pattern and by determining whether or not a common circuit characteristic exists.

The present invention configured as described above obtains the region code of the maximal incidence among region codes to which check circuits detecting errors, for example, a parity error caused with gradual increase in the frequency of an operational clock pulse fed to an integrated circuit, belongs. The apparatus obtains information on in which latch an error is caused with the region code of the maximal incidence, with reference to a mapping table that describes the mapping relationship between a region code and latches under the region code.

Subsequently, the present invention extracts a circuit portion in which an error can be captured with the region code of the maximal incidence by exhaustively tracing back circuit portions connected with each obtained latch, from the obtained latch to a latch under a region code described in the mapping table.

Subsequently, the present invention gives delay defects to an input and an output pin of each of logic elements included in the extracted circuit portion, generates delay-defect-detection test patterns for detecting the given delay defects, performs a delay test on the integrated circuit that outputs the region code of the maximal incidence by using the generated delay-defect-detection test patterns.

Based on an embodiment, the present invention will be explained in detail below.

FIG. 1 is a diagram illustrating an embodiment of the present invention.

The present embodiment illustrated in FIG. 1 is configured with a first tester 10 and a second tester 20.

The first tester 10 includes a frequency test execution unit 11 and an RC collection/analysis unit 12. The second tester 20 includes an RC-to-latch mapping table 21, a test subject circuit portion extraction unit 22, a test pattern generation unit 23, a delay test execution unit 24 and a delay defect analysis unit 25.

Next, the processing steps executed in the present embodiment configured as described above will be explained, while discussing the foregoing processing units.

[1] Configuration of the First Tester 10

The frequency test execution unit 11 includes an LSI tester. The frequency test execution unit 11 executes an operational test on each of LSIs as delay-defect analysis subjects, while the frequency of the operational clock pulse is gradually raised, and outputs a region code (RC) at the moment when the first parity error is caused.

The RC collection/analysis unit 12 collects region codes outputted from the frequency test execution unit 11, sorts the region codes in descending order of incidence, and then determines the region code corresponding to the maximal incidence.

As described above, the first tester 10 executes an operational test on each of LSIs as delay-defect analysis subjects, while the frequency of the operational clock pulse is gradually raised, determines the region code corresponding to the maximal incidence among the region codes each outputted at the moment when a parity error is caused, and then determines the LSI in which the region code corresponding to the maximal incidence is generated.

It is conceivable that a region code of low incidence is generated due to manufacturing variations and that a region code of high incidence is generated due to the inherent critical path. Therefore, in order to determine the approximate position of the inherent critical path, the first tester 10 performs processing in such a way as to determine the region code of the maximal incidence.

[2] Configuration of the Second Tester 20

[2-1] RC-to-Latch Mapping Table 21

Figures 2, 3:
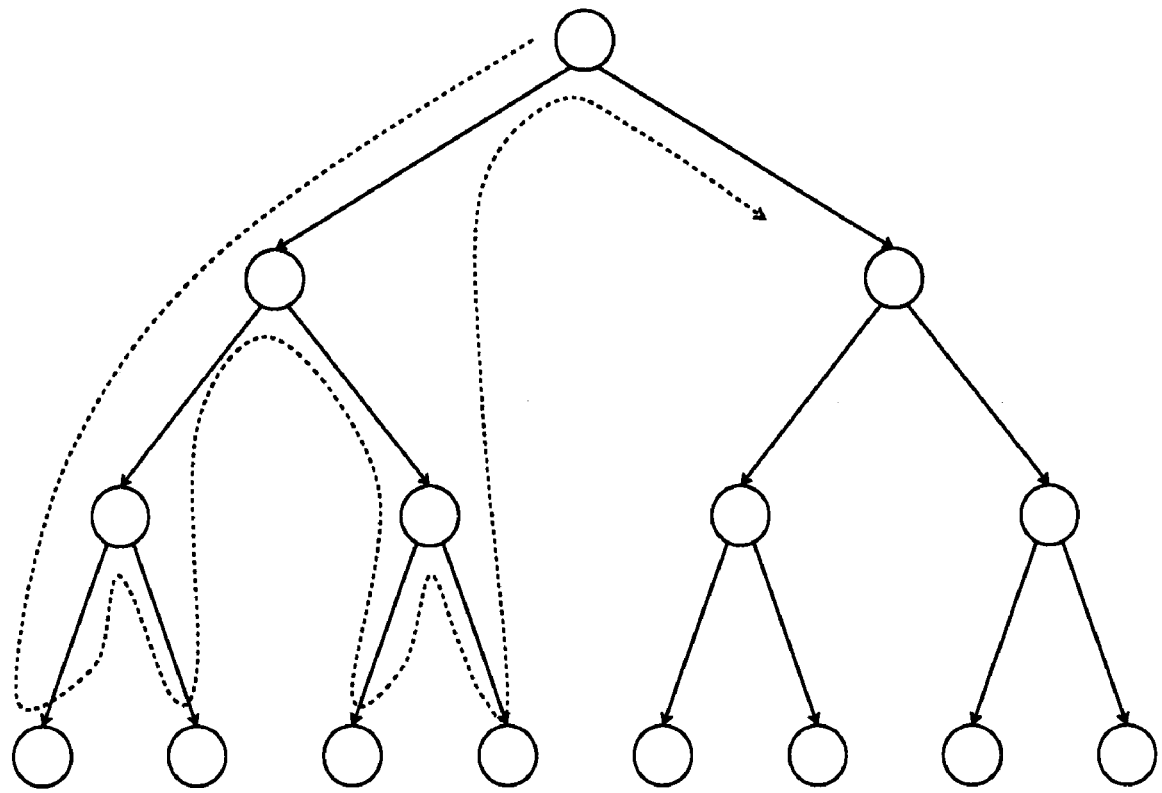
FIG. 2 is a diagram for explaining an RC-to-latch mapping table.
FIG. 3 is a diagram for explaining a deep first search method.

As represented in FIG. 2, the RC-to-latch mapping table 21 stores information on latches related to corresponding region codes (RC1 to RCn represented in FIG. 2) with which parity errors are caused. Additionally, an LSI designer preliminarily creates the RC-to-latch mapping table 21.

[2-2] Test Subject Circuit Portion Extraction Unit 22

When the first tester 10 notifies the region code of the maximal incidence, the test subject circuit portion extraction unit 22 firstly refers to the RC-to-latch mapping table 21 by using the region code as a key, and obtains information on latches related to the region code with which a parity error is caused. Subsequently, by exhaustively tracing back circuit portions connected with each obtained latch, from the obtained latch to the latch described in the RC-to-latch mapping table 21, the test subject circuit portion extraction unit 22 extracts circuit portions in which parity errors can be captured with the region code of the maximal incidence.

With regard to the LSI in which a parity error is caused with the region code of the maximal incidence, that region code is a region code at the moment when the first error is caused. Therefore, no parity error has been cased with other region codes. Consequently, it is ensured that, in the latch that is the destination of the tracing back, no parity error is caused.

Accordingly, the tracing back enables accurate extraction of circuit portions in which parity errors can be captured with the region code of the maximal incidence.

Thus, for example, by using the depth-first search method as illustrated in FIG. 3 and according to the algorithm represented in FIG. 4, the test subject extraction unit 22 exhaustively traces back circuit portions connected with each of the latches in which errors are caused with the region code of the maximal incidence, from each of latches in which errors are caused with the region code of the maximal incidence to the latch represented in the RC-to-latch mapping table 21, and extracts circuit portions in which parity errors can be captured with the region code of the maximal incidence.

In the algorithm represented in FIG. 4, a trace start mark is given to a latch from which the tracing back starts, a destination latch mark is given to a latch that is the destination of the tracing back, and, further, a transit mark is given to circuits that the tracing back transits.

Figure 5:
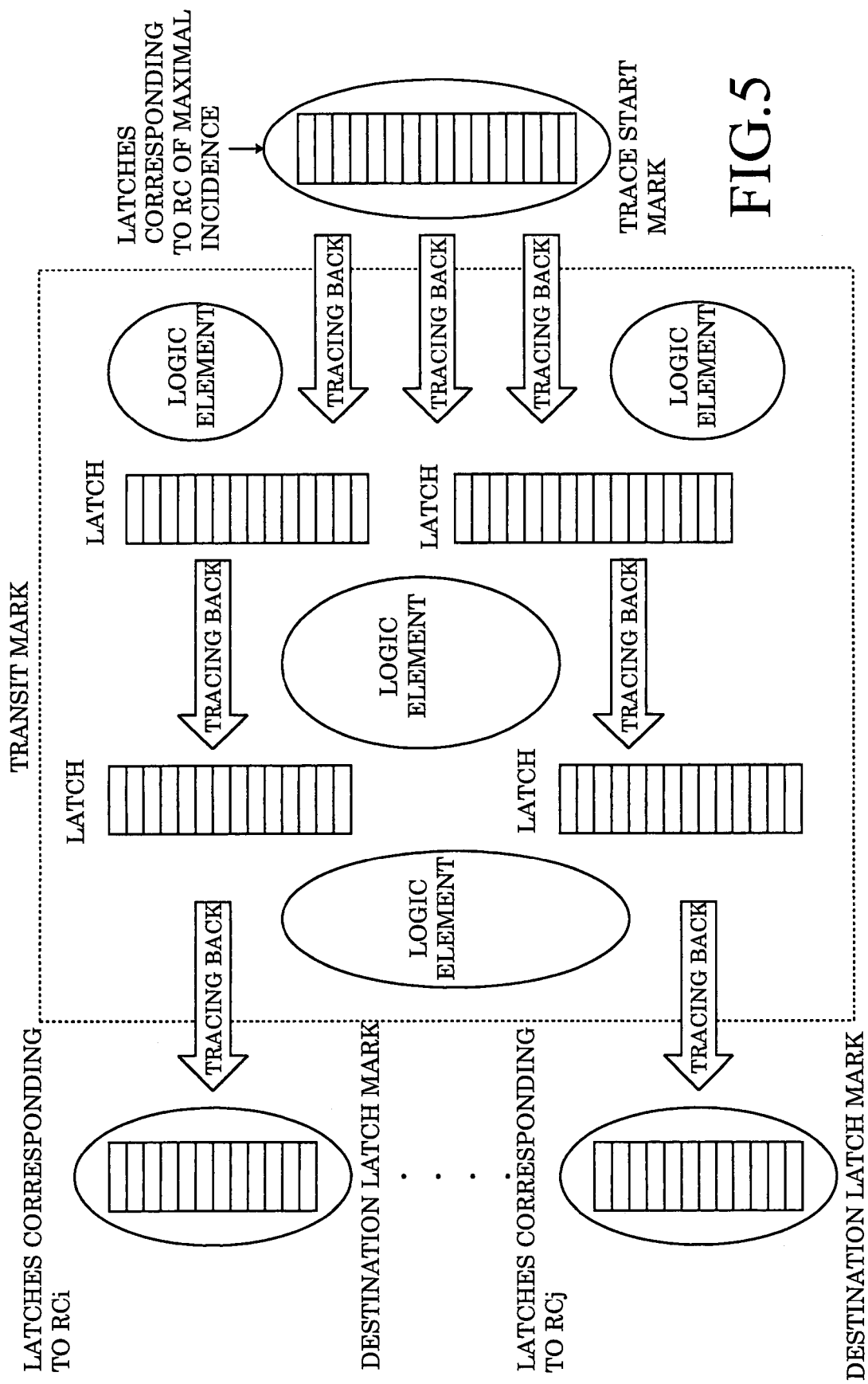
FIG. 5 is a diagram for explaining processing performed by the test subject circuit portion extraction unit.

As illustrated in FIG. 5, according to processing of extracting circuit portions through the algorithm represented in FIG. 4, the circuit portions, having the transit marks, situated between the latches registered in the RC-to-latch mapping table 21 and corresponding to the region codes of the maximal incidence and the latches registered in the RC-to latch mapping table 21 and corresponding to the other region codes than the region codes of the maximal incidence, are extracted as the circuit portions in which errors can be captured with the region code of the maximal incidence.

In this situation, the parity-error check circuits are not prepared for all the latches. Therefore, the extracted circuit portions include, in addition to logic elements, latches that are not registered in the RC-to-latch mapping table 21.

[2-3] Test Pattern Generation Unit 23

The test pattern generation unit 23 generates delay-defect-detection test patterns with which a slow-to-rise delay defect or a slow-to-fall delay defect is given to the input or the output pin of each of the logic elements (such as a NAND and an inverter) having the transit marks and then the delay defect is detected.

The logic elements to which the delay defects are given are situated between latches having the trace start marks and latches having the transit marks, between latches having the transit marks and latches having the transit marks, or between latches having the transit marks and latches having the destination latch marks.

Accordingly, for the delay-defect-detection test patterns, only the latches having the trace start marks, the latches having the transit marks, and the latches having the destination latch marks are scan latches. In other words, delay-defect-detection test patterns are generated with which setting and reading of effective values only for the foregoing latches are implemented and setting and reading of fixed values for the other latches are implemented.

With regard to the generation of the delay-defect-detection test patterns, the segment delay test disclosed in Non-Patent Document 1 described above can be used.

The method of the segment delay test is in such a way that, in order to detect the delay defect at a detection-subject pin for which a slow-to-rise delay defect or a slow-to-fall delay defect is defined, a test path (circuit portions activated by the delay-defect-detection test pattern) with which the delay in a partial path (referred to as a segment) including the pin becomes a specified value L or larger is transmitted to detect the delay defect.

Here, the value L is set to a delay value obtained from the frequency at which an error is caused, with the region code of the maximal incidence, in an LSI as the delay-defect analysis subject. For example, in case the error is caused at 2 GHz, 500 ps is set as the value L. Additionally, in case the delay does not become the specified value L or larger, the longest test path is selected.

In other words, with regard to a pin to which a delay defect is given, the test path for realizing the delay defect is not limited to one path, but a great number of paths can be the test path. Those test paths include a test path, the delay in which is smaller than the delay value in case an error is caused. Therefore, it does not make any sense to perform a delay test by using that test path. Accordingly, a delay-defect-detection test pattern is eventually generated that realizes a test path with which a delay, larger than a delay in case an error is caused, is demonstrated. Additionally, for the evaluation of the extent of the delay in a test path, a delay estimation value created during designing is used.

It is preferable to use a method in which a delay-defect-detection test pattern that realizes a test path having the circuit characteristic of a delay-defect analysis subject LSI is generated, although the method is not used in the segment delay test disclosed in Non-Patent Document 1.

In other words, with regard to a pin to which a delay defect is given, the test path for realizing the delay defect is not limited to one path, but a great number of paths can be the test path. Among those test paths, some have the circuit characteristic of an LSI as the delay-defect analysis subject, and some have no such circuit characteristic. Accordingly, a delay-defect-detection test pattern, which realizes a test path having the circuit characteristic of an LSI as the delay-defect analysis subject, is eventually selected so as to realize an effective delay test.

For that purpose, information on the circuit characteristic of an LSI as the delay-defect analysis subject is preliminarily extracted. For example, information items, such as kinds of cells (logic elements), an average net wiring distance (an average wiring distance between two cells), an average value of gate stages (an average value of cells between two latches), whether or not a special cell exists and respective utilization rates of cells, are extracted.

Based on the information items, the circuit characteristic of an LSI as the delay-defect analysis subject, such as that few long-distance wiring strips and a great number of gate stages exist, that a small number of gate stages and a great number of long-distance wiring strips exist or that a great number of specific special cells are used, can be obtained.

By using the circuit characteristic, the test pattern generation unit 23 selects a delay-defect-detection test pattern that realizes a test path having the circuit characteristic in a plurality of test paths for detecting a delay defect given to the input or the output pin of a logic element.

For example, the test pattern generation unit 23 extracts respective circuit characteristics of the test paths realized by delay-defect-detection test patterns that enable the detection of the delay defect given to the input or the output pin of a logic element. The test pattern generation unit 23 compares those circuit characteristics with the circuit characteristic of an LSI as the delay-defect analysis subject, and performs evaluations, such as that one test path is most similar to the circuit characteristic a and that another test path is most similar to the circuit characteristic b to give scores those test paths. Then, the test pattern generation unit 23 selects a delay-defect-detection test pattern that realizes the test path of the highest score to select a delay-defect-detection test pattern that realizes a test path having the circuit characteristic of an LSI as the delay-defect analysis subject.

As described above, the test pattern generation unit 23 generates delay-defect-detection test patterns with which a slow-to-rise delay defect or a slow-to-fall delay defect is given to the input or the output pin of each of the logic elements having the transit marks and then the delay defect is detected. Additionally, in order to support the defect analysis processing that is performed by the delay defect analysis unit 25, the test pattern generation unit 23 stores, in a memory, information items such as the delay value of the test path that is realized by the generated delay-defect-detection test pattern, the path information of the test path, and the circuit-characteristic information of the test path.

[2-4] Delay Test Execution Unit 24

By utilizing the delay-defect-detection test patterns generated by the test pattern generation unit 23, the delay test execution unit 24, including an LSI tester, considers the LSIs, which output the region code of the maximal incidence, to be LSIs as delay-defect analysis subjects, and performs delay tests on the LSIs.

With regard to the frequency to be utilized in the delay tests, respective frequencies, with which errors in the LSIs are caused with the region code of the maximal incidence, are utilized.

The delay test execution unit 24 stores the pattern numbers of the delay-defect-detection test patterns with which the delay tests produce delay values different from the expected values into memory.

[2-5] Delay Defect Analysis Unit 25

The delay defect analysis unit 25 determines the root-cause position of the delay defect, based on the pattern numbers of the delay-defect-detection test patterns stored by the delay test execution unit 24.

For example, based on the path information on test paths stored by the test pattern generation unit 23, the delay defect analysis unit 25 compares the test paths realized by the delay-defect-detection test patterns indicated by all the pattern numbers of the delay-defect-detection test patterns stored by the delay test execution unit 24, and then determines whether or not positions through which the test signals commonly pass. When a commonly passed position exists, the delay defect analysis unit 25 determines that the position is the root-cause position of the delay defect.

Additionally, based on the circuit-characteristic information on test paths stored by the test pattern generation unit 23, the delay defect analysis unit 25 compares the circuit characteristics of the test paths realized by the delay-defect-detection test patterns indicated by all the pattern numbers of the delay-defect-detection test patterns stored by the delay test execution unit 24, and then determines whether or not the test paths have the same circuit character. When the test paths do not have the same circuit character, the delay defect analysis unit 25 determines that the circuit characteristic is not the cause of the delay. When the test paths have the same circuit character, the delay defect analysis unit 25 determines the probability that the circuit characteristic is the cause of the delay to be high.

[2-6] Overall Processing by the Second Tester 20

As described above, when the second tester 20 receives the region code of the maximal incidence from the first tester 10, the second tester 20 obtains, with reference to the RC-to-latch mapping table 21, information on in which latch an error is caused with the region code of the maximal incidence. Furthermore, by exhaustively tracing back circuit portions connected with each obtained latch, from the latch to the latch under the region code described in the RC-to-latch mapping table 21, the second tester 20 extracts circuit portions in which the errors can be captured with the region code of the maximal incidence.

Subsequently, the second tester 20 gives delay defects to the input and the output pin of each of logic elements included in the extracted circuit portions, generates delay-defect-detection test patterns for detecting the given delay defects, performs a delay test on the LSI that outputs the region code of the maximal incidence by using the generated delay-defect-detection test patterns. Then, based on the result of the delay test, the second tester 20 determines the root-cause position of the delay defect.

Next, the present invention is explained in detail.

Figure 6:
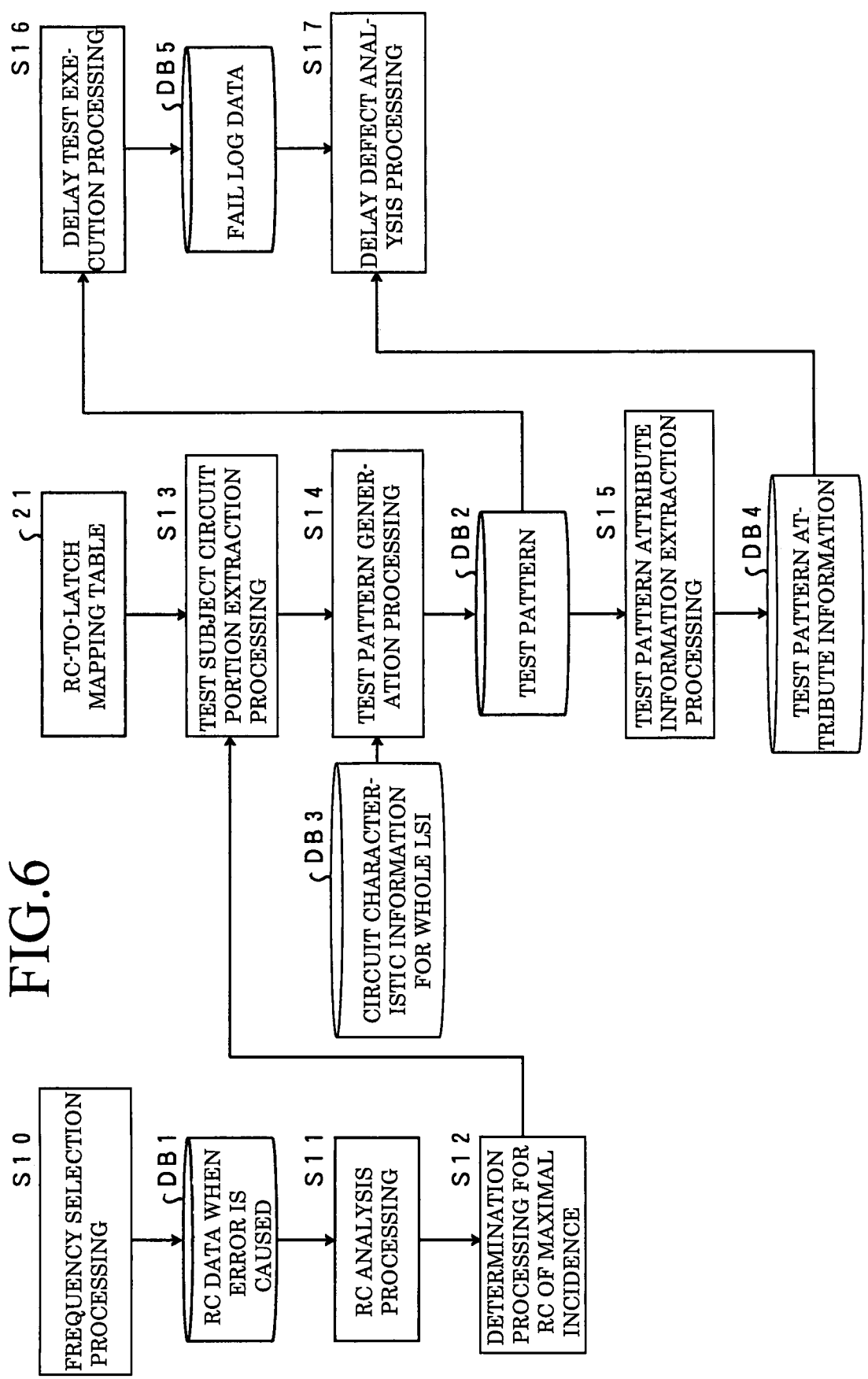
FIG. 6 is an example of an operational flow for realizing the present invention.

FIG. 6 illustrates an example of the operational flow of an LSI delay defect analysis processing according to the present invention. Here, reference numeral 21 denotes the RC-to-latch mapping table 21 illustrated in FIG. 1.

Next, the LSI delay defect analysis processing according to the present embodiment will be explained in detail according to the operational flow.

In the LSI delay defect analysis processing according to the present invention, in the first place, in step S10, the first tester 10 performs frequency selection processing. The first tester 10 executes an operational test on each of LSIs as delay-defect analysis subjects by raising the frequency of the operational clock pulse gradually. Then, the first tester 10 stores region codes outputted each time an parity error is caused in a database DB1.

Subsequently, in step S11, the first tester 10 performs region code analysis processing. The first tester 10 tallies the region codes stored in the database DB1 and sorts the region codes in descending order of incidence.

Subsequently, in step S12, the first tester 10 performs maximal incidence region code determination processing. The first tester 10 determines the region code of the maximal incidence based on the sorting result of the region code analysis processing.

Subsequently, in step S13, the second tester 20 performs test subject circuit portion extraction processing. The second tester 20 obtains, with reference to the RC-to-latch mapping table 21, information on the latch in which the error is caused with the region code of the maximal incidence. The second tester 20 exhaustively traces back circuit portions connected with each obtained latch, from the latch to the latch under the region code described in the RC-to-latch mapping table 21, and extract circuit portions in which the errors can be captured with the region code of the maximal incidence.

Subsequently, in step S14, the second tester 20 performs test pattern generation processing. The second tester 20 gives delay defects to the input and the output pin of each of logic elements included in the circuit portions extracted through the test subject circuit extraction processing, generates delay-defect-detection test patterns for detecting the given delay defects, and stores the test patterns in a database DB2.

In this situation, with reference to circuit characteristic information stored in a database DB3 that stores the circuit-characteristic information items of all LSIs as delay-defect analysis subjects, the second tester 20 generates delay-defect-detection test patterns that realize test paths having the respective circuit characteristic of LSIs as the delay-defect analysis subjects.

Subsequently, in step S15, the second tester 20 performs test pattern attribute information extraction processing. The second tester 20 extracts information items (test pattern attribute information) such as the delay value of a test path that is realized by the delay-defect-detection test pattern generated through the test pattern generation processing, the path information of the test path, and the circuit-characteristic information of the test path and stores the information items in a database DB4.

Subsequently, in step S16, the second tester 20 performs delay test execution processing. The second tester 20 performs delay tests on the LSI that outputs the region code of the maximal incidence by using the delay-defect-detection test patterns generated through the test pattern generation processing and stores in a database DB5 the test pattern numbers of the delay-defect-detection test patterns that generate values different from expected values.

In the last place, in step S17, the second tester 20 performs delay defect analysis processing. The second tester 20 determines the root-cause position of the delay defect based on the delay-defect-detection test patterns indicated by the numbers of delay-defect-detection test patterns stored in the database DB5 and the attribute information items of the delay-defect-detection test patterns stored in the database DB4.

Figure 7:
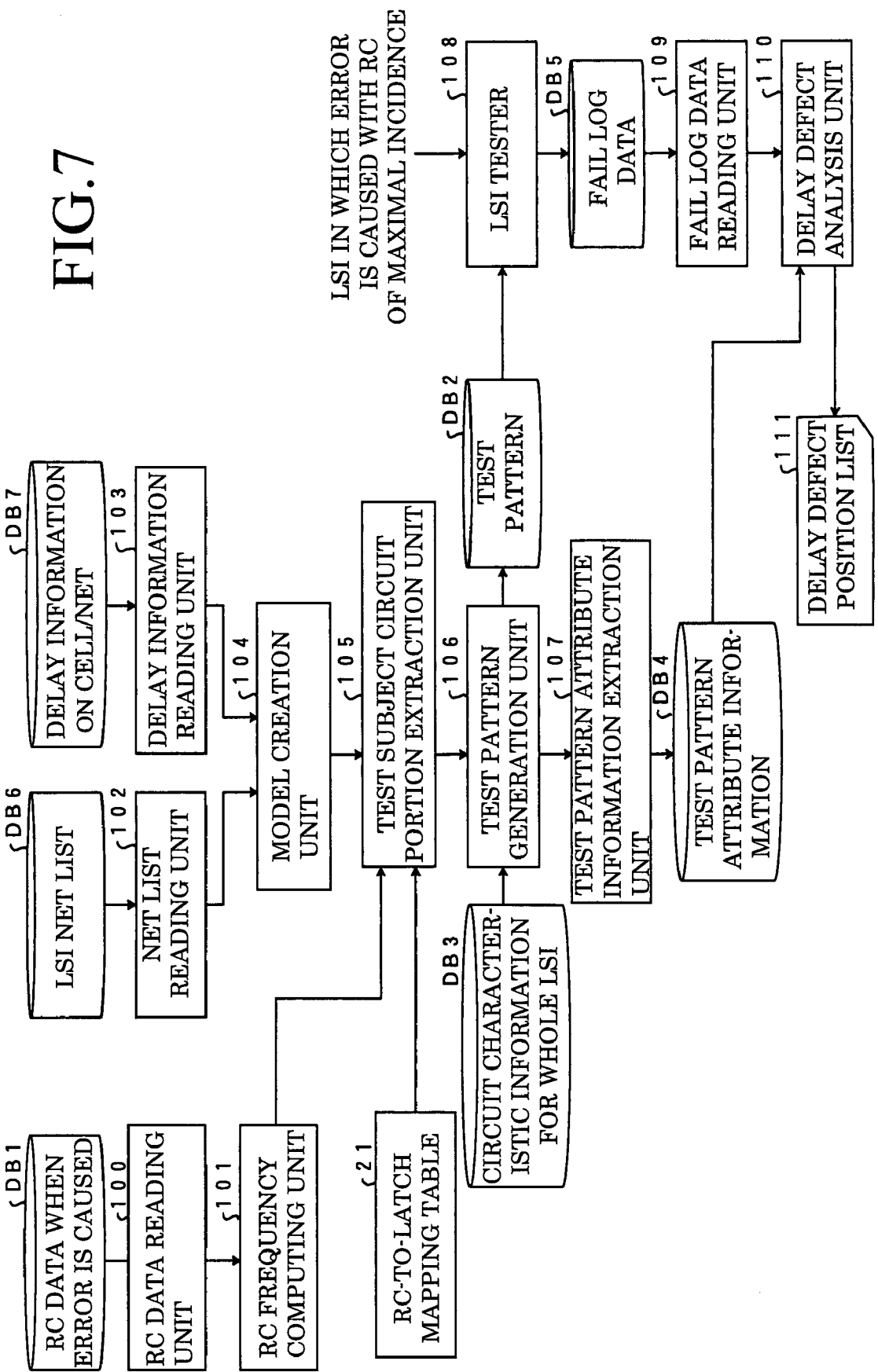
FIG. 7 is an example of a functional structure for realizing the present invention.
Figure 8:
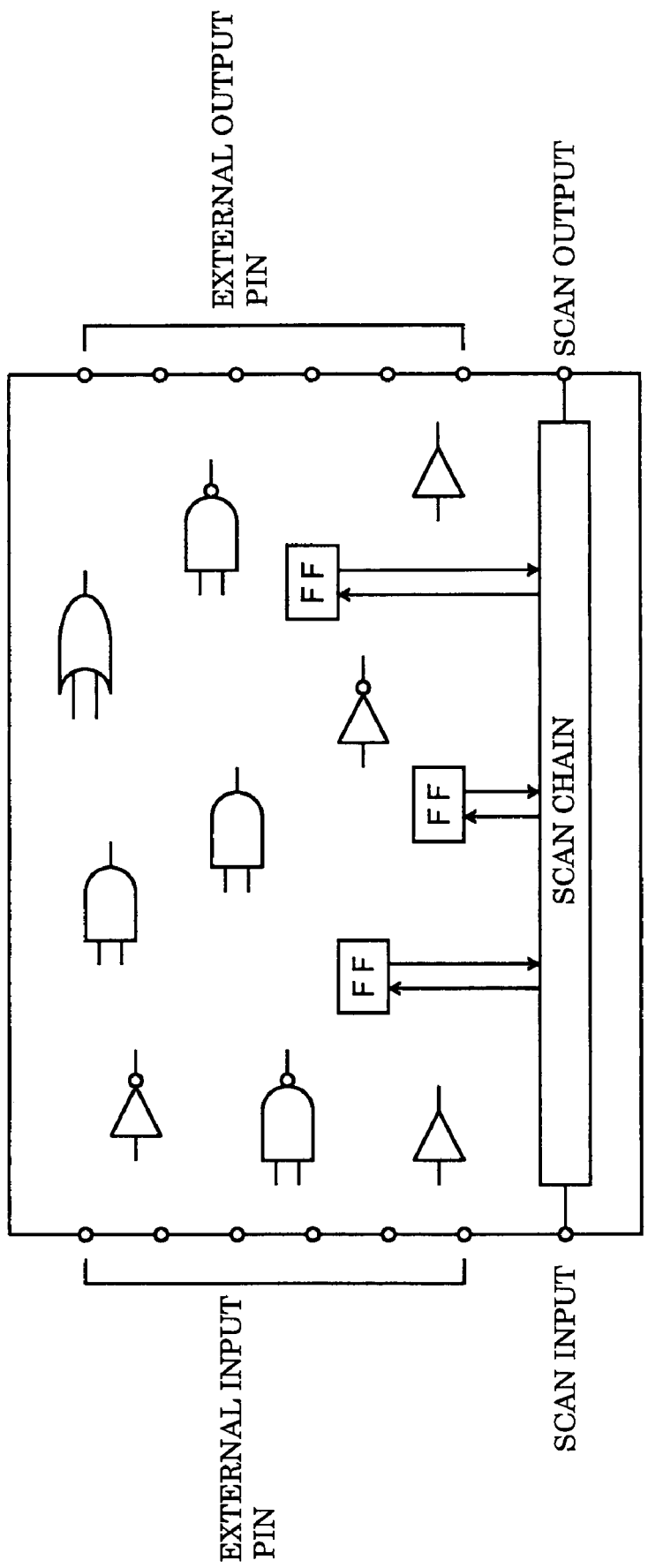
FIG. 8 is a diagram for explaining a scan test method.
Figure 9:
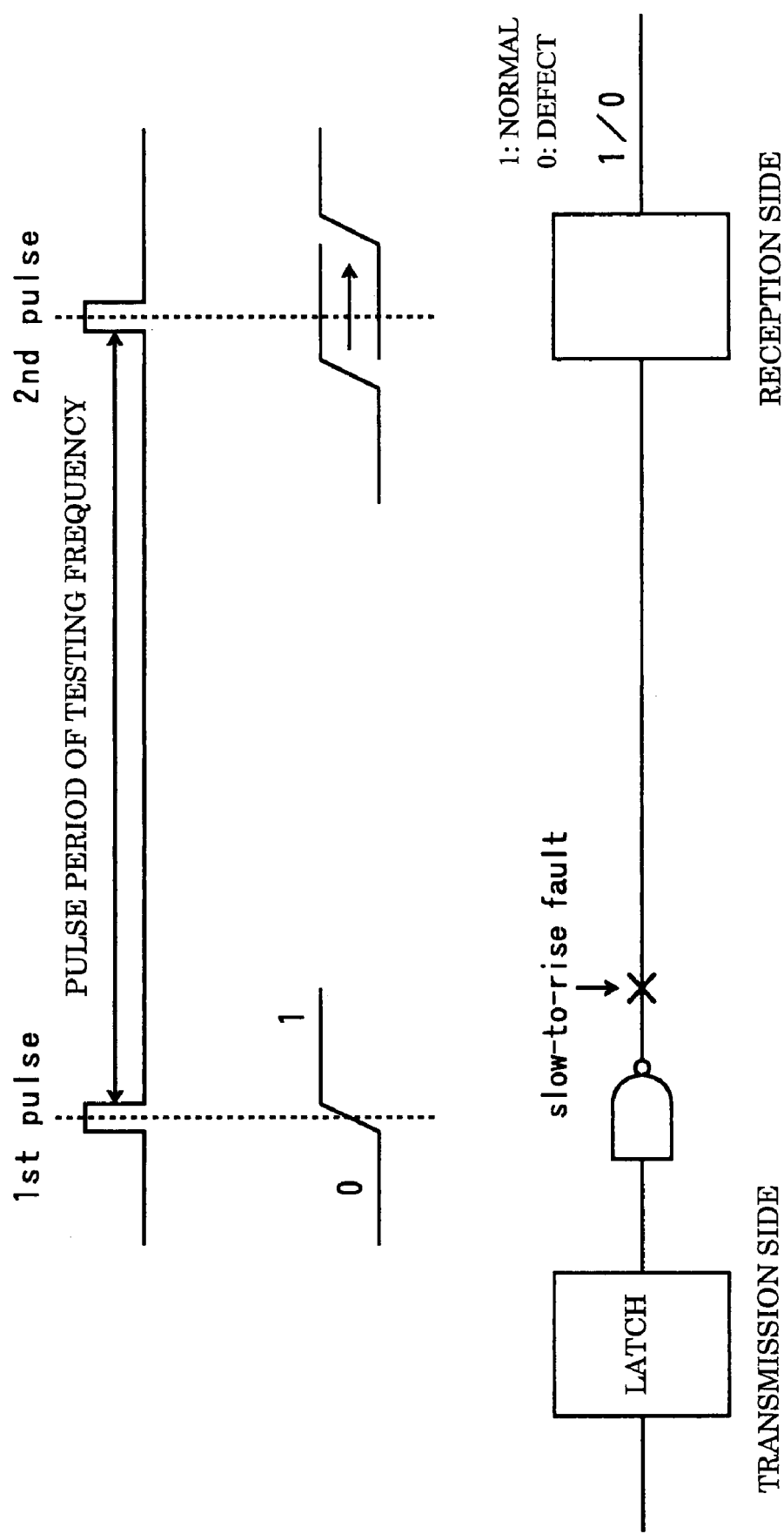
FIG. 9 is a diagram for explaining frequency-performance test processing.

FIG. 7 illustrates an example of a functional structure for realizing an LSI delay defect analysis processing according to the present invention.

In FIG. 7, databases DB1 to DB5 denote the same databases as the databases DB1 to DB5 illustrated in FIG. 6. A database DB6 is a database for storing a net list (circuit connection information) for LSIs to be analyzed for a delay defect. A database DB7 is a database for storing delay information (delay information obtained in designing) on the cells and the nets of LSIs to be analyzed for a delay defect.

Additionally, reference numeral 21 denotes the RC-to-latch mapping table illustrated in FIG. 1. Reference numeral 100 denotes an RC data reading unit. Reference numeral 101 denotes an RC frequency computing unit. Reference numeral 102 denotes a net list reading unit. Reference numeral 103 denotes a delay information reading unit. Reference numeral 104 denotes a model creation unit. Reference numeral 105 denotes a test subject circuit portion extraction unit. Reference numeral 106 denotes a test pattern generation unit. Reference numeral 107 denotes a test pattern attribute-information extraction unit. Reference numeral 108 denotes an LSI tester. Reference numeral 109 denotes a Fail log data reading unit. Reference numeral 110 denotes a delay defect analysis unit. Reference numeral 111 denotes a delay defect position list.

The RC frequency computing unit 101 tallies region codes read from the database DB1 by the RC data reading unit 100 and sorts the region codes in descending order of incidence, and determines the region code of the maximal incidence.

The model creation unit 104 creates the circuit model of an LSI as the delay defect analysis subject based on a net list read from the database DB6 by the net list reading unit 102 and delay information on cells and nets read from the database DB7 by the delay information reading unit 103.

The test subject circuit portion extraction unit 105 obtains, with reference to the RC-to-latch mapping table 21, information on in which latch an error is caused with the region code of the maximal incidence. Then, by exhaustively tracing back circuit portions connected with each obtained latch, from the latch to the latch under the region code described in the RC-to-latch mapping table 21, the test subject circuit portion extraction unit 105 extracts circuit portions in which the errors can be captured with the region code of the maximal incidence.

The test pattern generation unit 106 gives delay defects to the input and the output pin of each of logic elements included in the circuit portions extracted by the test subject circuit portion extraction unit 105. Then, the test pattern generation unit 106 generates delay-defect-detection test patterns for detecting the given delay defects, and stores the generated patterns in the database DB2. In this situation, with reference to circuit characteristic information stored in the database DB3, the test pattern generation unit 106 generates delay-defect-detection test patterns that realize test paths having the respective circuit characteristic of LSIs as the delay-defect analysis subjects.

The test pattern attribute information extraction unit 107 extracts information items, such as the delay value of a test path that is realized by the delay-defect-detection test pattern generated by the test pattern generation unit 106, the path information of the test path, and the circuit-characteristic information of the test path, and stores the information items in the database DB4.

The LSI tester 108 performs delay tests on the LSI that outputs the region code of the maximal incidence by using the delay-defect-detection test patterns generated by the test pattern generation unit 106. Then, the LSI tester 108 stores the test pattern numbers of the delay-defect-detection test patterns that generate values different from expected values in a database DB5.

The delay defect analysis unit 110 determines the root-cause positions of the delay defects based on the numbers of the delay-defect-detection test pattern read from the database DB5 by the Fail log data reading unit 109 and the attribute information items of the delay-defect-detection test patterns stored in the database DB4, and outputs the delay defect position list 111 that describes the delay defect positions.

As described above, with an LSI delay defect analysis processing according to the present embodiment, in analyzing an LSI delay defect, by narrowing circuit portions that are bottleneck in frequency performance and generating the delay-defect-detection test patterns for the narrowed circuit portions, it is possible to determine which circuit portion among the narrowed circuit portions are the bottleneck in frequency performance. Therefore, the determination of the circuit portion that is the bottleneck in frequency performance can be implemented rapidly and uniquely.

The present invention, which can be applied to the delay defect analysis for an integrated circuit that is configured with hardware such as a microprocessor, realizes the rapid and unique determination of the circuit portion that is the bottleneck in frequency performance.

What is claimed is:

1. A method for analyzing a delay defect in an integrated circuit, the method comprising:
   gradually raising a frequency of an operational clock for each of integrated circuits to be analyzed for a delay defect and collecting region codes when respective first errors are caused; and
   tallying the collected region codes and determining a region code of a maximal incidence.

2. The method according to claim 1, further comprising:
   obtaining information on in which latch an error is caused with the region code of the maximal incidence, with reference to a mapping table that describes the mapping relationship between a region code and latches under the region code; and
   extracting a circuit portion in which an error can be captured with the region code of the maximal incidence by exhaustively tracing back circuit portions connected with each obtained latch from the obtained latch to a latch under the region code described in the mapping table.

3. The method according to claim 2, further comprising:
   giving delay defects to an input and an output pin of each of logic elements included in the extracted circuit portion and generating delay-defect-detection test patterns for detecting the given delay defects.

4. The method according to claim 3, wherein, in generating the delay-defect-detection test patterns, based on circuit characteristic of an integral circuit as a delay defect analysis subject, by selecting a delay-defect-detection test pattern that realizes a test path having the circuit characteristic among delay-defect-detection test patterns that enable detection of the delay defects, generating the delay-defect-detection test patterns for detecting the delay defects.

5. The method according to claim 3, further comprising:
   performing a delay test on an integrated circuit in which an error is caused with the region code of the maximal incidence by using the generated delay-defect-detection test patterns, and selecting a delay-defect-detection test pattern that causes a defect of a value different from an expected value; and
   analyzing the cause of a delay defect based on the selected delay-defect-detection test pattern.

6. The method according to claim 5, wherein, in analyzing the cause of the delay defect, analyzing the cause of a delay defect by comparing paths realized by the selected delay-defect-detection test pattern and by determining whether or not a commonly passed position exists.

7. The method according to claim 5, wherein, in analyzing the cause of a delay defect, analyzing the cause of a delay defect by comparing the circuit characteristics of paths realized by the selected delay-defect-detection test pattern and by determining whether or not a common circuit characteristic exists.

8. An apparatus for analyzing a delay defect that analyzes a cause of a delay defect by performing a delay test on an integrated circuit in which an error is caused with a region code of a maximal incidence selected among integrated circuits to be analyzed for a delay defect, the apparatus comprising:
   a processor executing:
      an obtaining unit obtaining information on in which latch an error is caused with the region code of the maximal incidence, with reference to a mapping table that describes the mapping relationship between a region code and latches under the region code;
      an extracting unit extracting a circuit portion in which an error can be captured with the region code of the maximal incidence by exhaustively tracing back circuit portions connected with each of latches obtained by the obtaining unit from the obtained latch to a latch under the region code described in the mapping table; and
      a generating unit giving delay defects to an input and an output pin of each of logic elements included in the circuit portion extracted by the extracting unit and generating delay-defect-detection test patterns for detecting the given delay defects.

9. The apparatus according to claim 8, further comprising:
   a selecting unit performing a delay test on an integrated circuit in which an error is caused with the region code of the maximal incidence by using the generated delay-defect-detection test patterns, and selecting a delay-defect-detection test pattern that causes a defect of a value different from an expected value; and
   an analyzing unit analyzing the cause of a delay defect based on the delay-defect-detection test pattern selected by the selecting unit.

* * * * *